(12) United States Patent
Bar et al.

(10) Patent No.: US 9,385,424 B2
(45) Date of Patent: Jul. 5, 2016

(54) THREE-DIMENSIONAL INTEGRATED STRUCTURE COMPRISING AN ANTENNA

(71) Applicants: STMicroelectronics S.A., Montrouge (FR); Commissariat à l'Énergie Atomique et aux Énergies Alternatives, Paris (FR)

(72) Inventors: Pierre Bar, Grenoble (FR); Laurent Dussopt, Grenoble (FR); Jean-François Carpentier, Grenoble (FR)

(73) Assignees: STMicroelectronics SA, Montrouge (FR); Commissariat A L'Energie Atomique et aux Energies Alternatives, Paris (FR)

( * ) Notice: Subject to any disclaimer, the term of this patent is extended or adjusted under 35 U.S.C. 154(b) by 244 days.

(21) Appl. No.: 13/920,237

(22) Filed: Jun. 18, 2013

(65) Prior Publication Data
US 2013/0335297 A1 Dec. 19, 2013

(30) Foreign Application Priority Data
Jun. 19, 2012 (FR) ...................... 1255719

(51) Int. Cl.
*H01Q 1/50* (2006.01)
*H01L 23/66* (2006.01)
(Continued)

(52) U.S. Cl.
CPC ............ *H01Q 1/50* (2013.01); *H01L 23/49822* (2013.01); *H01L 23/552* (2013.01); *H01L 23/66* (2013.01); *H01Q 1/243* (2013.01); *H01Q 9/0457* (2013.01); *H01Q 23/00* (2013.01); *H01L 23/49816* (2013.01); *H01L 24/11* (2013.01); *H01L 24/13* (2013.01); *H01L 24/16* (2013.01); *H01L 24/29* (2013.01); *H01L 24/32* (2013.01); *H01L 24/73* (2013.01);
(Continued)

(58) Field of Classification Search
CPC ....... H01Q 1/50; H01Q 1/243; H01Q 9/0457; H01L 2224/16225; H01L 2224/16227; H01L 23/552; H01L 23/49816; H01L 23/49822
See application file for complete search history.

(56) References Cited

U.S. PATENT DOCUMENTS

| 5,903,239 A | 5/1999 | Takahashi et al. |
| 7,110,741 B2 * | 9/2006 | Knopik et al. ................ 455/333 |

(Continued)

FOREIGN PATENT DOCUMENTS

GB 2484704 4/2012

OTHER PUBLICATIONS
French Search Report and Written Opinion dated Jun. 19, 2012 from corresponding French Application No. FR1255719.
(Continued)

*Primary Examiner* — Trinh Dinh
(74) *Attorney, Agent, or Firm* — Gardere Wynne Sewell LLP

(57) ABSTRACT

The three-dimensional integrated structure including a support element, an interface device connected to the support element by first electrically conductive connection, an integrated circuit arranged between the support element and the interface device and connected to the interface device by second electrically conductive connection, a filler region between the second electrically conductive connection and between the interface device and the integrated circuit, and an antenna, having a radiating element in electromagnetic coupling with an excitation element through the interconnection of a slot, the antenna being distributed over the interface device and the integrated circuit.

1 Claim, 2 Drawing Sheets

(51) Int. Cl.
*H01Q 1/24* (2006.01)
*H01Q 9/04* (2006.01)
*H01Q 23/00* (2006.01)
*H01L 23/552* (2006.01)
*H01L 23/498* (2006.01)
*H01L 23/00* (2006.01)

(52) U.S. Cl.
CPC .......... *H01L 2223/6627* (2013.01); *H01L 2223/6677* (2013.01); *H01L 2224/0401* (2013.01); *H01L 2224/05082* (2013.01); *H01L 2224/05166* (2013.01); *H01L 2224/05187* (2013.01); *H01L 2224/05647* (2013.01); *H01L 2224/11462* (2013.01); *H01L 2224/13147* (2013.01); *H01L 2224/16225* (2013.01); *H01L 2224/16227* (2013.01); *H01L 2224/2919* (2013.01); *H01L 2224/32225* (2013.01); *H01L 2224/73204* (2013.01); *H01L 2924/10253* (2013.01); *H01L 2924/14* (2013.01); *H01L 2924/157* (2013.01); *H01L 2924/15192* (2013.01); *H01L 2924/15321* (2013.01); *H01L 2924/15788* (2013.01)

(56) References Cited

U.S. PATENT DOCUMENTS

| | | | | |
|---|---|---|---|---|
| 8,878,727 | B2* | 11/2014 | Goldberger | 343/700 MS |
| 2004/0113844 | A1 | 6/2004 | Knopik et al. | |
| 2009/0135079 | A1* | 5/2009 | Dokai et al. | 343/850 |
| 2010/0311340 | A1 | 12/2010 | Rofougaran et al. | |
| 2011/0181488 | A1* | 7/2011 | Tang | 343/873 |

OTHER PUBLICATIONS

"Microstrip Antenna Aperture Coupled to a Microstripline" *Electronic Letters* Jan. 17, 1985 21(2) 49-50.

* cited by examiner

THREE-DIMENSIONAL INTEGRATED STRUCTURE COMPRISING AN ANTENNA

CROSS REFERENCE TO RELATED APPLICATIONS

This application claims the priority benefit of French patent application serial number 12/55719, filed on Jun. 19, 2012, which is hereby incorporated by reference to the maximum extent allowable by law.

BACKGROUND

The disclosure relates to antennas, and more particularly antennas integrated on silicon and intended to receive and/or transmit signals according to the standard IEEE 802.15, at a frequency of the order of 60 GHz.

SUMMARY

One embodiment provides a compact antenna module, produced within a three-dimensional integrated structure, with low losses and capable of transmitting signals over a very short distance, for example 1 meter, with low power consumption.

One aspect provides a three-dimensional integrated structure comprising a support element, for example a printed circuit board (PCB), an interface device, for example of the "interposer" type, connected to a support element by first electrically conductive connection means, for example bumps, an integrated circuit arranged between the support element and the interface device and connected to the interface device by second electrically conductive connection means, advantageously electrically conductive pillars, a filler region extending between the second electrically conductive connection means and between the interface device and the integrated circuit;

the three-dimensional structure also comprises means forming an antenna, having a first antenna substrate and a second antenna substrate which are separated by an earth plane equipped with an aperture, such as a slot, a radiating element, for example of the pellet type, separated from the earth plane by the first antenna substrate, and an excitation element separated from the earth plane by the second antenna substrate;

the said aperture is configured in such a way as to permit electromagnetic coupling between the excitation element and the radiating element;

and the interface device incorporates the radiating element, the first antenna substrate and the earth plane, while the integrated circuit incorporates the excitation element; furthermore, the second antenna substrate is formed by at least a part of the filler region.

The use of an antenna without direct connection between the excitation element and the radiating element, and distributed between the interface device and the integrated circuit which supports the processing means associated with the antenna and which itself lies between the interface device and the support element, makes it possible to obtain a particularly compact antenna module with the desired performance.

Furthermore, the second electrically conductive connection means, for example pillars, have a structure identical to those permitting the electrical connection between the various elements of the integrated circuit and the support element (for example a printed circuit board) by means of metal tracks of the interface device and the first electrically conductive connection means, for example the bumps.

For this reason, the second electrically conductive connection means making it possible to adjust the height of the second antenna substrate do not require any particular additional manufacturing step.

These second electrically conductive connection means may have any possible structures, for example pillars or microbumps. This being the case, the use of pillars is particularly advantageous. This is because adjusting their height during their manufacture makes it possible to adjust the thickness of the second antenna structure and therefore gives greater flexibility with regard to the adjustment of the performance of the antenna, for example in terms of transmission power. This thickness adjustment of the second antenna substrate would be more difficult and more expensive to obtain by a simple stack of metallization levels which are produced with a so-called "thin-film" interconnection technology, which is conventionally used in current technology nodes in which the thickness of each metallization level is of the order of 1 micron.

Owing to its small size, such a three-dimensional integrated structure incorporating such an antenna module can easily be arranged inside a wireless communication apparatus, for example a cellular mobile telephone.

BRIEF DESCRIPTION OF THE DRAWINGS

Other advantages and characteristics of the embodiments will become apparent on studying the detailed description of entirely nonlimiting embodiments and the appended drawings, in which.

DETAILED DESCRIPTION

Figure 1:
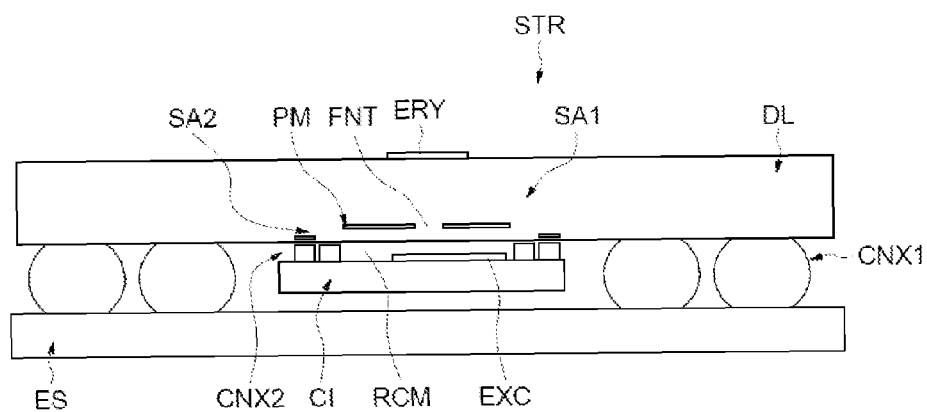
FIGS. 1 to 3 schematically illustrate various embodiments.

In FIG. 1, the reference STR denotes a three-dimensional integrated structure having a support element ES, here formed by a integrated circuit board PCB, an integrated circuit CI and an interface device DL, also referred to by the person skilled in the art in the field of three-dimensional structures by the term "interposer".

The interface device makes it possible both to support the integrated circuit CI and to participate in the electrical connection between the integrated circuit CI and the support element ES.

More precisely, the electrical connection between the support element ES and the interface device DL is ensured by first electrically conductive connection means CNX1, in this case microbumps, and the electrical interface between the integrated circuit CI and the interface device DL is ensured by second electrically conductive connection means, in this case electrically conductive pillars CNX2.

The electrical connection between the pillars CNX2 and the microbumps CNX1 is ensured in a conventional way by tracks arranged within the interface device DL.

A filler region RCM is located between the integrated circuit CI and the interface device DL and contains a filler material, for example an epoxy resin, known by the person skilled in the art by the term "underfill" and enclosing in particular the pillars CNX2.

The three-dimensional integrated structure STR also has an antenna module having a first antenna substrate SA1 and a second antenna substrate SA2, which are separated by an earth plane PM equipped with an aperture (here a slot) FNT.

The module forming an antenna also comprises a radiating element ERY, here a square metal pellet, separated from the earth plane PM by the first antenna substrate SA1, as well as an excitation element EXC, here a metal microstripline, separated from the earth plane PM by the second antenna substrate SA2.

It can be seen in FIG. 1 that the interface device DL incorporates the radiating element ERY, the first antenna substrate SA1 and the earth plane PM, while the integrated circuit CI incorporates the excitation element EXC.

Furthermore, as will be seen in more detail below, the second antenna substrate SA2 is formed by at least a part of the filler region RCM.

The slot FNT located under the radiating element ERY is configured in such a way as to permit electromagnetic coupling between the excitation element and the radiating element.

This type of antenna is well known to the person skilled in the art, who will readily know how to position, configure and dimension the various elements forming this antenna module so as to obtain the desired electromagnetic coupling as well as the antenna tuning to a determined frequency.

If required, the person skilled in the art may refer to the article by D. M. POZAR entitled "Microstrip antenna aperture-coupled to a microstripline", Electronics Letters, 17 Jan. 1985, vol. 21, No. 2.

During operation, the excitation element or supply line, through which a current flows, excites the aperture which may be of any shape, for example a slot or a circular aperture, the dimensions of which are adjusted in order to obtain radiation at a given frequency from the aperture. The slot radiates and excites the radiating element, which in turn radiates at the said frequency.

Figure 2:
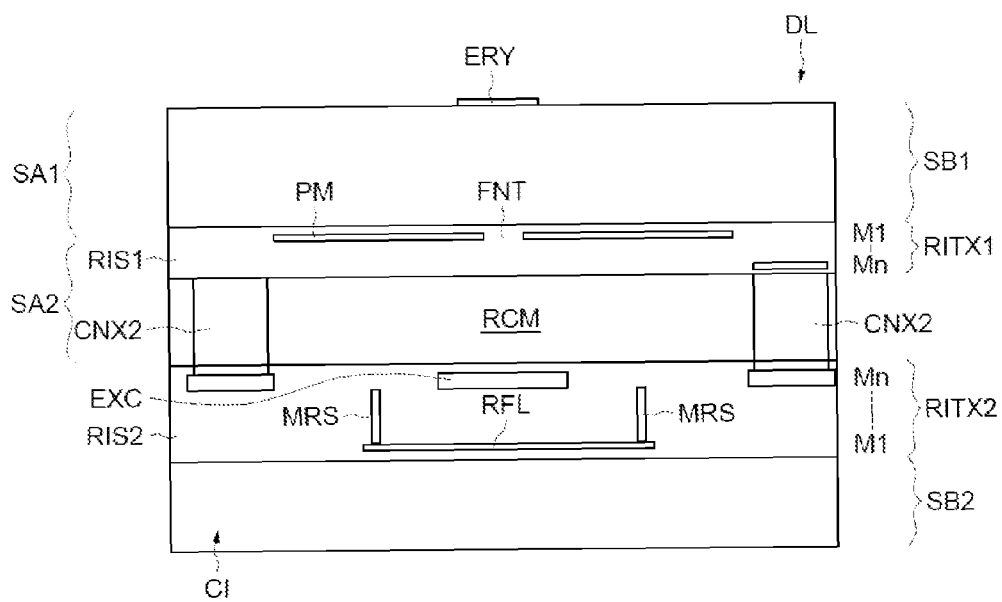

Reference will now be made more particularly to FIG. 2, which illustrates the antenna module in more detail.

In a conventional way, the interface device DL in this case has a semiconductor substrate SB1, for example a silicon substrate, preferably with a high resistivity. Here, high resistivity is intended to mean a resistivity of more than 100 ohm.cm, or even 1 kiloohm.cm.

On a front face of this substrate SB1, there is an interconnection part RITX1 commonly referred to by the person skilled in the art by the term "BEOL" (Back End Of Line), having in a conventional way a plurality of metallization levels containing metal tracks of which some are connected together by vias. All of the metal tracks and the vias are encapsulated in an insulating region RIS1. This so-called "thin-film" interconnection technology leads to a maximum thickness of around 5 to 10 microns depending on the number of metallization levels.

In a conventional way, the metal tracks and vias of the region RITX1 make it possible to establish the electrical connection between the pillars CNX2 and the microbumps CNX1.

The substrate SB1 could be of a different type, for example of glass obtained from a wafer according to a technology of the "silicon wafer" type, while still being intended to support a so-called "thin-film" interconnection technology.

While the radiating element ERY is arranged on the back face of the substrate SB1 of the device DL which is the face opposite the front face supporting the region RITX1, the earth plane PM of the means forming an antenna is produced within a metallization level of the interconnection part RITX1. In this regard, the earth plane is produced here at the lowest metallization level, namely in this case the metallization level M1, that is to say the metallization layer closest to the substrate SB1. It could, however, be produced within another metallization level.

The first antenna substrate SA1 then includes the semiconductor substrate SB1 and the part of the first insulating region RIS1 located between the earth plane PM and the substrate SB1.

The integrated circuit CI includes, also in a conventional way, a semiconductor substrate SB2, for example of silicon.

The semiconductor substrate SB2 has a front face which supports, also in a conventional way, an interconnection region RITX2 which has a similar structure to the region RITX1, that is to say having metallization levels M1-Mn as well as levels of vias, in a conventional way.

The metal tracks located at the various metallization levels, as well as the various vias, are here again enclosed in an insulating region RIS2.

The excitation element EXC is produced, for example, within the highest metallization level Mn, that is to say the metallization level located furthest away from the substrate SB2. It could, however, be produced within another metallization level.

The second antenna substrate SA2 thus comprises the part of the first insulating region RIS1 located between the earth plane PM and the filler region RCM, the part of the filler region RCM located facing the earth plane PM and the excitation element EXC and between the pillars CNX2, and the part of the second insulating region RIS2 covering the excitation element EXC.

The pillars CNX2 located on either side of the filler region part, which is arranged facing the earth plane and the excitation element EXC, may be pillars used to establish electrical interconnections with the microbumps CNX1, or alternatively pillars not used to carry out any interconnection. Whatever the case, the pillars CNX2 are produced in a conventional way, typically by electrolytic growth of copper from an initiation layer, for example of Ti/TiN (diffusion barrier) and copper, which is arranged at the top of certain metallic regions of the metallization level Mn.

The height of the pillars can thus be adjusted precisely, which makes it possible to adjust the dimension of the second antenna substrate SA2 and thus adjust the performance of the antenna.

By way of indication, for the application envisaged, there may be a pillar height of the order of 30 microns with a spacing of 40 microns between the excitation element EXC and the earth plane PM. The distance between the earth plane PM and the radiating element ERY may be of the order of 200 to 300 microns.

This structure is particularly compact with a radiating element in the form of a square pellet having a side length of less than one millimeter.

As a variant, the means forming an antenna may furthermore comprise a reflector RFL produced within a lower metallization level of the interconnection part RITX2, for example at the lowest metallization level M1. This reflector is delimited by side walls MRS formed by a plurality of vias and portions of metal lines and extending from the metallization level M1 to the metallization level Mn.

It would also be possible for the portion of the filler region RCM arranged facing the earth plane of the excitation element EXC to be fully surrounded by a plurality of pillars CNX2 so as to form a Faraday cage.

Figure 3:
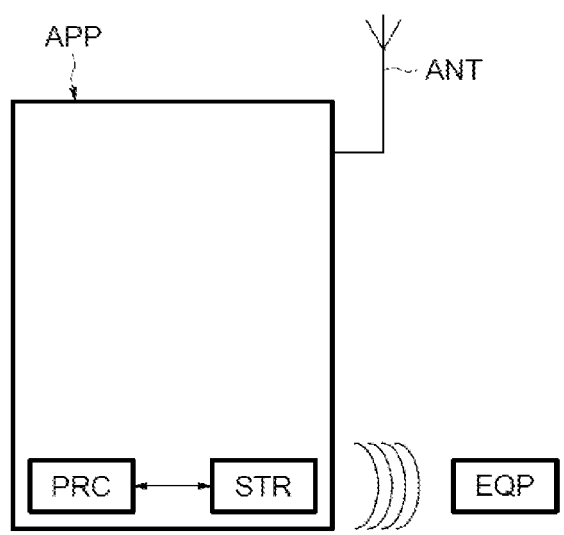

As illustrated in FIG. 3, such a three-dimensional structure STR may be incorporated within a wireless communication apparatus APP, for example a cellular mobile telephone equipped with an antenna ANT. The structure STR is connected to processing means PRC, such as a processor, and thus makes it possible to communicate over a very short distance, typically 1 meter, with equipment EQP at a frequency of the order of 60 GHz with a high bandwidth, typically 5 gigabits per second.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. Three-dimensional integrated structure, comprising:
a support element,
an interface device connected to the support element by first electrically conductive connection means,
an integrated circuit arranged between the support element and the interface device and connected to the interface device by second electrically conductive connection means, the integrated circuit comprising a semiconductor substrate having a first face supporting an interconnection part having a plurality of metallization levels enclosed in an insulating region,
a filler region standing between the second electrically conductive connection means and between the interface device and the integrated circuit, and
means forming an antenna, having a first antenna substrate and a second antenna substrate which are separated by an earth plane equipped with an aperture, a radiating element separated from the earth plane by the first antenna substrate, an excitation element separated from the earth plane by the second antenna substrate, the excitation element being produced within an upper one of the metallization levels of the interconnection part, and a reflector produced within a lower one of the metallization levels of the interconnection part facing the excitation element, the aperture being configured in such a way as to permit electromagnetic coupling between the excitation element and the radiating element,
the interface device incorporating the radiating element, the first antenna substrate and the earth plane,
the integrated circuit incorporating the excitation element, and
the second antenna substrate being formed by at least a part of the filler region.

* * * * *